US012796537B2

(12) United States Patent
Chang

(10) Patent No.: US 12,796,537 B2
(45) Date of Patent: Nov. 10, 2026

(54) SEMICONDUCTOR PACKAGE WITH ENHANCED BONDING FORCE

(71) Applicant: Taiwan Semiconductor Manufacturing Company, Ltd., Hsinchu (TW)

(72) Inventor: Jen-Yuan Chang, Hsinchu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 764 days.

(21) Appl. No.: 17/702,764

(22) Filed: Mar. 23, 2022

(65) Prior Publication Data

US 2023/0307418 A1 Sep. 28, 2023

(51) Int. Cl.

*H10W 90/20* (2026.01)
*H10W 72/90* (2026.01)

(Continued)

(52) U.S. Cl.

CPC .......... *H10W 90/00* (2026.01); *H10W 72/952* (2026.01); *H10W 72/967* (2026.01); *H10W 80/00* (2026.01); *H10W 90/792* (2026.01)

(58) Field of Classification Search

CPC ..... H01L 25/0657; H01L 24/05; H01L 24/06; H01L 24/08; H01L 24/80; H01L 25/50; H01L 2224/05647; H01L 2224/06515; H01L 2224/08145; H01L 2224/80001; H01L 2924/3512; H01L 24/09; H01L 2224/80894; H01L 2225/06541;

(Continued)

(56) References Cited

U.S. PATENT DOCUMENTS

| | | | | |
|---|---|---|---|---|
| 10,510,668 | B1 | 12/2019 | Chen et al. | |
| 2018/0025970 | A1* | 1/2018 | Kao | H10D 84/038 257/401 |

(Continued)

FOREIGN PATENT DOCUMENTS

| | | | |
|---|---|---|---|
| CN | 111211058 | A | 5/2020 |
| CN | 113380727 | A | 9/2021 |

OTHER PUBLICATIONS

The first office action and search report issued in Chinese corresponding application 202310137711.2, mailed on Aug. 14, 2026.

*Primary Examiner* — Zandra V Smith
*Assistant Examiner* — Daniel J Hibbert
(74) *Attorney, Agent, or Firm* — Kilpatrick Townsend & Stockton LLP

(57) ABSTRACT

A semiconductor package is provided. The semiconductor package includes: a bottom die having a first bonding layer formed at a top surface of the bottom die; a top die on the bottom die, wherein the top die comprises a second bonding layer formed at a bottom surface of the top die, and the top die is bonded to the bottom die by bonding the first bonding layer and the second bonding layer using hybrid bonding; a dummy die on the bottom die and lateral to the top die, wherein the dummy die comprises a third bonding layer formed at a bottom surface of the dummy die, and the dummy die is bonded to the bottom die by bonding the first bonding layer and the third bonding layer; and at least one dummy metal pad formed in one of the first bonding layer and the third bonding layer and not electrically connected.

20 Claims, 15 Drawing Sheets

(51) Int. Cl.
*H10W 90/00* (2026.01)
*H10W 80/00* (2026.01)

(58) Field of Classification Search
CPC . H01L 2225/06527; H01L 2225/06555; H01L 25/105; H01L 25/16; H10W 90/00; H10W 72/952; H10W 72/967; H10W 80/00; H10W 90/792; H10W 72/01; H10W 90/20; H10W 90/297; H10W 72/90; H10W 80/301
See application file for complete search history.

(56) References Cited

U.S. PATENT DOCUMENTS

2020/0091123 A1* 3/2020 Sung .................. H10W 70/611
2020/0161263 A1* 5/2020 Chen .................. H03K 19/1776

* cited by examiner

SEMICONDUCTOR PACKAGE WITH ENHANCED BONDING FORCE

FIELD

Embodiments of the present disclosure relate generally to semiconductor packaging, and more particularly to semiconductor packages with an enhanced bonding force.

BACKGROUND

In recent years, the semiconductor industry has experienced rapid growth due to continuous improvement in the integration density of a variety of electronic components (e.g., transistors, diodes, resistors, capacitors, etc.). For the most part, improvement in integration density has resulted from iterative reduction of minimum feature size, which allows more components to be integrated into a given area.

These continuously scaled electronic components require smaller packages that occupy less area than previous packages. Exemplary types of packages include quad flat pack (QFP), pin grid array (PGA), ball grid array (BGA), flip chips (FC), three-dimensional integrated circuits (3D ICs), wafer-level packages (WLPs), and package on package (PoP) devices. For instance, front-end 3D inter-chip stacking technologies are used for re-integration of chiplets partitioned from System on Chip (SoC). The resulting integrated chip outperforms the original SoC in system performance. It also affords the flexibility to integrate additional system functionalities. Advantages of those advanced packaging technologies like 3D inter-chip stacking technologies include improved integration density, faster speeds, and higher bandwidth because of the decreased length of interconnects between the stacked chips. However, there are quite a few challenges to be handled for the technologies of advanced packaging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION OF THE INVENTION

Figure 1:
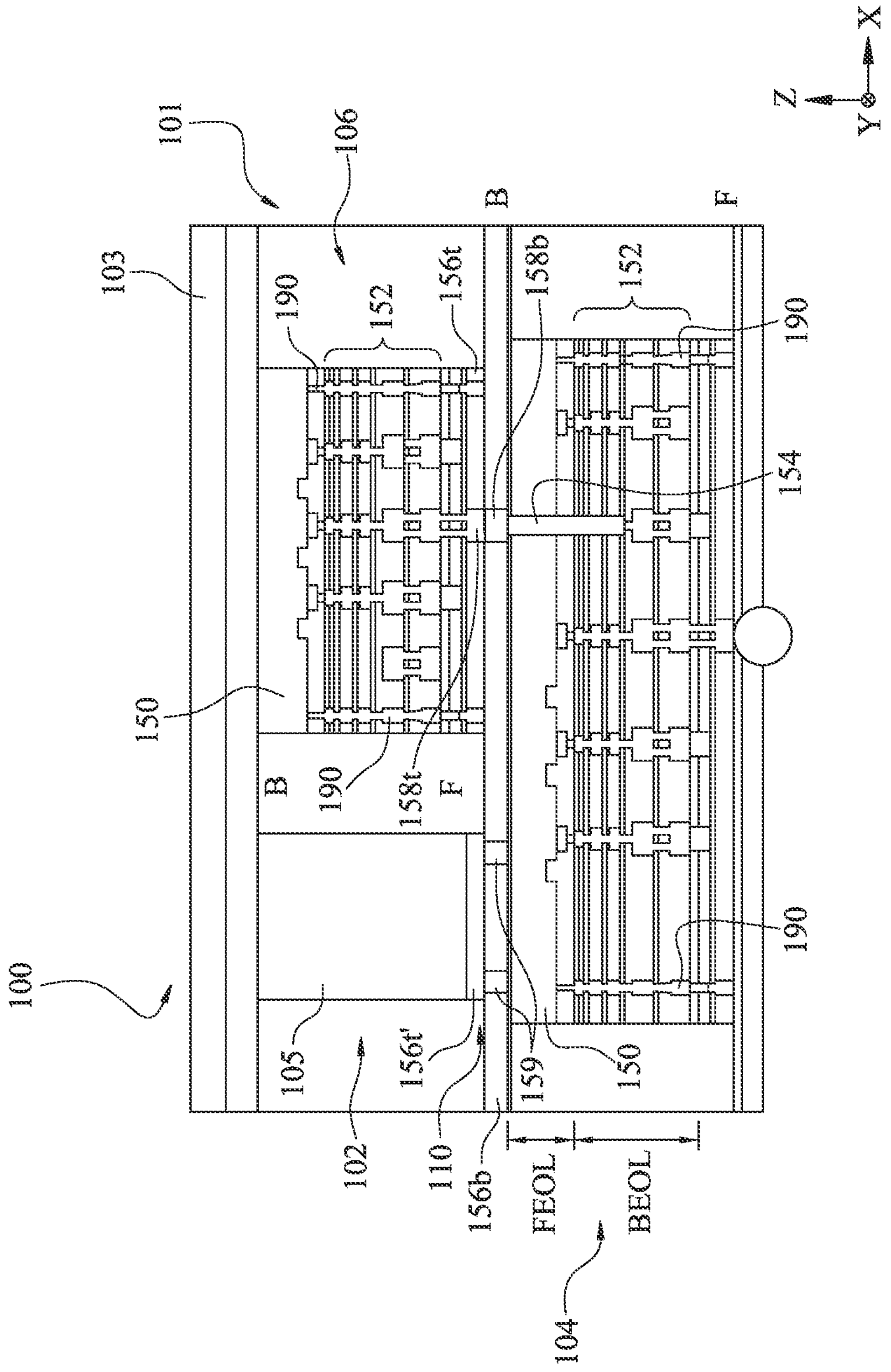
FIG. 1 is a cross-sectional diagram illustrating an example semiconductor package in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Some of the features described below can be replaced or eliminated and additional features can be added for different embodiments. Although some embodiments are discussed with operations performed in a particular order, these operations may be performed in another logical order.

Packaging technologies were once considered just back-end processes, almost an inconvenience. Times have changed. Computing workloads have evolved more over the past decade than perhaps the previous four decades. Cloud computing, big data analytics, artificial intelligence (AI), neural network training, AI inferencing, mobile computing on advanced smartphones, and even self-driving cars are all pushing the computing develop. Modern workloads have brought packaging technologies to the forefront of innovation, and they are critical to a product's performance, function, and cost. These modern workloads have pushed the product design to embrace a more holistic approach for optimization at the system level.

Chip-on-Wafer-on-Substrate (CoWoS) is a wafer-level multi-chip packaging technology often used in conjunction with hybrid bonding. CoWoS is a packaging technology that incorporates multiple chips side-by-side on a silicon interposer in order to achieve better interconnect density and performance. Individual chips are bonded through, for example, micro-bumps on a silicon interposer, forming a chip-on-wafer (CoW) structure. The CoW structure is then subsequently thinner such that through-silicon-vias (TSVs) are exposed, which is followed by the formation of bumps (e.g., C4 bumps) and singulation. The CoW structure is then bonded to a package substrate forming the CoWoS structure. Since multiple chips or dies are generally incorporated in a side-by-side manner, the CoWoS is considered a 2.5-dimensional (2.5D) wafer-level packaging technology.

On the other hand, those multiple chips that are bonded to the interposer in a CoWoS structure can each include stacking dies or chiplets (i.e., modular dies), with multi-layers, multi-chip sizes, and multi-functions. In one implementation, the stacking dies are bonded together using hybrid bonding (HB). Hybrid bonding is a process that stacks and bonds dies using both dielectric bonding layers and metal-to-metal interconnects in advanced packaging. Since no bumps like micro-bumps are used, hybrid bonding is regarded as a bumpless bonding technique. Hybrid bonding can provide improved integration density, faster speeds, and higher bandwidth. In addition to die-to-die bonding, hybrid bonding can also be used for wafer-to-wafer bonding and die-to-wafer bonding. In another implementation, the stacking dies are bonded together using fusion bonding.

Stacking dies featuring bumpless ultra-high-density-vertical stacking (often using hybrid bonding) is sometimes referred to System on Integrated Chips (SoIC) technologies. SoIC technologies can achieve high performance, low power, and minimum resistance-inductance-capacitance (RLC). SoIC technologies integrate active and passive chips that are partitioned from System on Chip (SoC), into a new integrated SoC system, which is electrically identical to native SoC, to achieve better form factor and performance. A die stack bonded together using hybrid bonding is sometimes, therefore, referred to as a SoIC die stack ("SoIC die stack" and "die stack" are used interchangeably throughout the disclosure).

Since SoIC die stack is bonded using hybrid bonding or fusion bonding, the bonding force at the interface between two dies may not be as strong as that for other bonding techniques. As a result, the stacking interface between two dies may, partially or even entirely, become loose, and the interfacing dies may be detached from each other, when subjected to external impacts. This phenomenon is sometimes also referred to as chip delamination. Chip delamination would result in an open circuit or defective structure between the two dies.

On the other hand, even though two dies are bonded together using hybrid bonding (using both dielectric bonding layers and metal-to-metal interconnects), a package including the SoIC die stack comprised of those two dies may still have interfaces between two dielectric layers. One example of such dielectric-to-dielectric bonding interfaces occurs when a top die and a dummy die are both bonded to a bottom die that has a larger size than the top die. The dummy die is used to fill the size gap between the bottom die and the top die, making the structure of the package more stable. Although the top die and the bottom die are bonded using hybrid bonding, the dummy die and the bottom die are bonded using a dielectric-to-dielectric bonding technique (like fusion bonding) because there is no need for metal-to-metal interconnects between the bottom die and the dummy die. The dielectric-to-dielectric bonding interface between the dummy die and the bottom die is located at the same horizontal plane as the hybrid bonding interface between the top die and the bottom die.

It has been observed, for example, by confocal scanning acoustic microscopy (CSAM), that voids sometimes occur at the dielectric-to-dielectric bonding interface. The voids are typically water-containing voids between the two dielectric layers. The water is a product of a polymerization process, in which silanol groups (i.e., Si—OH) located at the surface of the silicon-containing dielectric (e.g., silicon dioxide, silicon oxynitride, etc.) layers polymerize to siloxane groups (i.e., Si—O—Si) and water (i.e., $H_2O$) in accordance with $Si—OH+Si—OH \rightarrow Si—O—Si+H_2O$. The water-containing voids can reduce the bonding force at the dielectric-to-dielectric bonding interface and even cause chip delamination in some cases, therefore restricting the application of the dielectric-to-dielectric bonding techniques, especially in the context of SoIC die stacks and packages including SoIC die stacks. Details of the polymerization process will be described below with reference to FIGS. 2A-2B.

In accordance with some embodiments of the present disclosure, semiconductor packages and method for making semiconductor packages are provided. Dummy metal pads are formed in one of the bonding layers at the dielectric-to-dielectric bonding interface. The dummy metal pads are not connected to any semiconductor devices, therefore not serving as an interconnect between two dies. In one implementation, the dummy metal pads 159 are made of copper. Because of the dummy metal pads at the dielectric-to-dielectric bonding interface, the dielectric-to-dielectric bonding interface also has some dielectric-to-metal (in one implementation, dielectric-to-copper) contact in addition to the dielectric-to-dielectric contact. Because of the dummy metal pads 159 made of copper in this example, copper oxidation occurs in accordance with $H_2O+Cu \rightarrow CuO+H_2$. That is, the copper atoms in the dummy metal pads are oxidized to become copper oxide (CuO), and gaseous hydrogen ($H_2$) is generated. The gaseous hydrogen can diffuse and exit the dielectric-to-dielectric bonding interface. As a result, the water-containing voids are reduced or even eliminated, therefore enhancing the bonding force between the bonding layers. Since the dummy metal pads are not used for any electrical connection, the copper oxide does not affect any electrical connections or functionality of the bottom die. The number of dummy metal pads can vary, and various patterns can be employed.

FIG. 1 is a cross-sectional diagram illustrating an example semiconductor package 100 in accordance with some embodiments. In the example shown in FIG. 1, the semiconductor package 100 includes, among other things, a SoIC die stack 101 and a dummy die 102. Thus, the semiconductor package 100 is a SoIC package. The SoIC die stack 101 includes a bottom die 104 and a top die 106. The bottom die 104 has a front side (denoted as "F" in FIG. 1) and a back side (denoted as "B" in FIG. 1). In the example shown in FIG. 1, the bottom die 104 has been flipped, i.e., upside down. The top die 106 has a front side (denoted as "F" in FIG. 1) and a back side (denoted as "B" in FIG. 1). In the example shown in FIG. 1, the top die 106 has been flipped, i.e., upside down. The front side of the top die 106 is bonded to the back side of the bottom die 104 using hybrid bonding in the example shown in FIG. 1, details of which will be described below.

The dummy die 102 is bonded to the back side of the bottom die 104 (lateral to the top die 106) using dielectric-to-dielectric bonding in the example shown in FIG. 1, details of which will be described below. In the example shown in FIG. 1, the top die 106 has a smaller size, in a first horizontal direction and a second horizontal direction (i.e., the X-direction and the Y-direction shown in FIG. 1) than the bottom die 104. That is, the bottom surface of the top die 106 has a smaller area than that of the top surface of the bottom die 104. Thus, the dummy die 102 is introduced to bridge the horizontal dimension gap between the bottom die 104 and the top die 106.

In the example shown in FIG. 1, the back side of the top die 106 and the top surface of the dummy die 102 are both bonded to a carrier wafer 103, which has been processed using thinning processes (e.g., silicon grinding) and planarization processes (e.g., chemical-mechanical polishing (CMP)).

A bonding layer 156*b* ("b" stands for "bottom") is formed at the back side and on a silicon substrate 150 of the bottom die 104. In one implementation, the bonding layer 156*b* is made of a dielectric and can be used for bonding with another bonding layer 156*t* ("t" stands for "top") at the front side and the bottom surface of the top die 106. In one implementation, the bonding layers 156*b* and 156*t* are made of silicon dioxide. In another implementation, the bonding layers 156*b* and 156*t* are made of silicon oxynitride. It should be understood that these examples are not intended to be limiting, and other silicon-containing dielectric materials may be employed in other examples.

One or more semiconductor devices (e.g., transistors, resistors, capacitors, inductors, etc.) are formed on the silicon substrate 150, before being flipped, in a front-end-of-line (FEOL) process. A multilayer interconnect (MLI) structure 152 is disposed over the one or more semiconductor devices, before being flipped. The MLI structure 152 includes a combination of dielectric layers and conductive layers configured to form various interconnect structures. The conductive layers are configured to form vertical interconnect features (e.g., device-level contacts, vias, etc.) and horizontal interconnect features (e.g., conductive lines extending in a horizontal plane). Vertical interconnect features typically connect horizontal interconnect features in different layers (e.g., a first metal layer often denoted as "M1" and a fifth metal layer often denoted as "M5") of the MLI structure 152. During operation of the bottom die 104, the interconnect structures are configured to route signals and/or distribute signals (e.g., clock signals, voltage signals, ground signals) to the one or more semiconductor devices to fulfill certain functions. It should be understood that although the MLI structure 152 is depicted in FIG. 1 with a given number of dielectric layers and conductive layers, the present disclosure contemplates MLI structures having more or fewer dielectric layers and/or conductive layers depending on design requirements of the bottom die 104.

In the example shown in FIG. 1, the bottom die 104 includes a hybrid bonding metal pad 158*b* formed in the bonding layer 156*b*, and the hybrid bonding metal pad 158*b* is connected to the MLI structure 152 through a through-silicon via (TSV) 154, which penetrates the silicon substrate 150 in the vertical direction (i.e., the Z-direction). It should be understood that although only one hybrid bonding metal pad 158*b* and a TSV 154 is shown in FIG. 1, this is not intended to be limiting. In other examples, there are many hybrid bonding metal pads 158*b* and corresponding TSVs 154, with small critical dimensions and pitches, thus achieving better interconnect density and performance (e.g., faster speeds, higher bandwidth, and the like). In one implementation, the hybrid bonding metal pad 158*b* is made of copper.

A seal ring 190 is a metallization structure that is located between and separates the core circuitry of the bottom die 104 and the peripheral regions (or edges) of the bottom die 104. The seal ring 190 surrounds the core circuitry in the X-Y plane and prevents the intrusion of cracks and moisture penetration or chemical damage like acid, alkaline containing or diffusion of contaminating species.

Likewise, the top die 106 has a bonding layer 156*t* ("t" stands for "top") formed at the front side and the bottom surface and over an MLI structure 152, before the top die 106 is flipped. In one implementation, the bonding layer 156*t* is made of a dielectric and can be used for bonding with the bonding layer 156*b* at the bottom die 104, as mentioned above. Likewise, the top die 106 includes a hybrid bonding metal pad 158*t* ("t" stands for "top") formed in the bonding layer 156*t*, and the hybrid bonding metal pad 158*t* is connected to the MLI structure 152 through, for example, a via. It should be understood that although only one hybrid bonding metal pad 158*t* is shown in FIG. 1, this is not intended to be limiting. In other examples, there are many hybrid bonding metal pads 158*t*, with small critical dimensions and pitches, thus achieving better interconnect density and performance (e.g., faster speeds, higher bandwidth, and the like). In one implementation, the hybrid bonding metal pad 158*t* is made of copper. As such, a copper-to-copper interconnect is formed between the bottom die 104 and the top die 106 using the hybrid bonding metal pads 158*b* and 158*t*.

Likewise, one or more semiconductor devices (e.g., transistors, resistors, capacitors, inductors, etc.) are formed on the silicon substrate 150, before being flipped, in a front-end-of-line (FEOL) process. The MLI structure 152 is disposed over the one or more semiconductor devices, before being flipped. Similarly, a seal ring 190 is located between and separates the core circuitry of the top die 106 and the peripheral regions (or edges) of the top die 106. The seal ring 190 surrounds the core circuitry in the X-Y plane and prevents the intrusion of cracks and moisture penetration or chemical damage like acid, alkaline containing or diffusion of contaminating species.

For die-to-die boding, back-end processes, such as dicing, die handling, and die transport on film frame, have to be adapted to front-end clean levels, allowing high bonding yields on a die level. For example, copper hybrid bonding is conducted in a cleanroom in a wafer fab, instead of in an outsourced semiconductor assembly and test (OSAT) facility. Pick-and-place systems are often used to handle dies in the context of die-to-die boding or die-to-wafer boding. A pick-and-place system is an automatic system that can pick a top die and place it onto the bottom die or a host wafer, often in a high-speed manner.

The dummy die 102 includes a bulk silicon 105 and a bonding layer 156*t*' ("t" standing for "top") formed at the bottom surface of the bulk silicon 105. The bonding layer 156*t*' is made of a dielectric and can be used for bonding with the bonding layer 156*b* at the bottom die 104, as mentioned above.

At the dielectric-to-dielectric bonding interface 110 between the bonding layer 156*b* of the bottom die 104 and the bonding layer 156*t*' of the dummy die 102, there are dummy metal pads 159 formed in one of the bonding layers 156*b* and 156*t*'. In the example shown in FIG. 1, there are two dummy metal pads 159 formed in the bonding layer 156*b*. The dummy metal pads 159 are not connected to any semiconductor devices in the bottom die 104, therefore not serving as an interconnect between two dies (i.e., the bottom die 104 and the dummy die 102). It should be understood that this example is not intended to be limiting. The number of dummy metal pads 159 can vary (e.g., one, three, four, ten, twenty, etc.). The dummy metal pads 159 can also be formed in the bonding layer 156*t*' instead of the bonding layer 156*b*. In one implementation, the dummy metal pads 159 are made of copper.

Because of the dummy metal pads 159 at the dielectric-to-dielectric bonding interface 110, the dielectric-to-dielectric bonding interface 110 also has some dielectric-to-metal (in one implementation, dielectric-to-copper) contact in addition to the dielectric-to-dielectric contact. As will be explained in detail below with reference to FIGS. 2A-2C, the dummy metal pads 159 can solve the issues related to water-containing voids mentioned above.

Figure 2A:
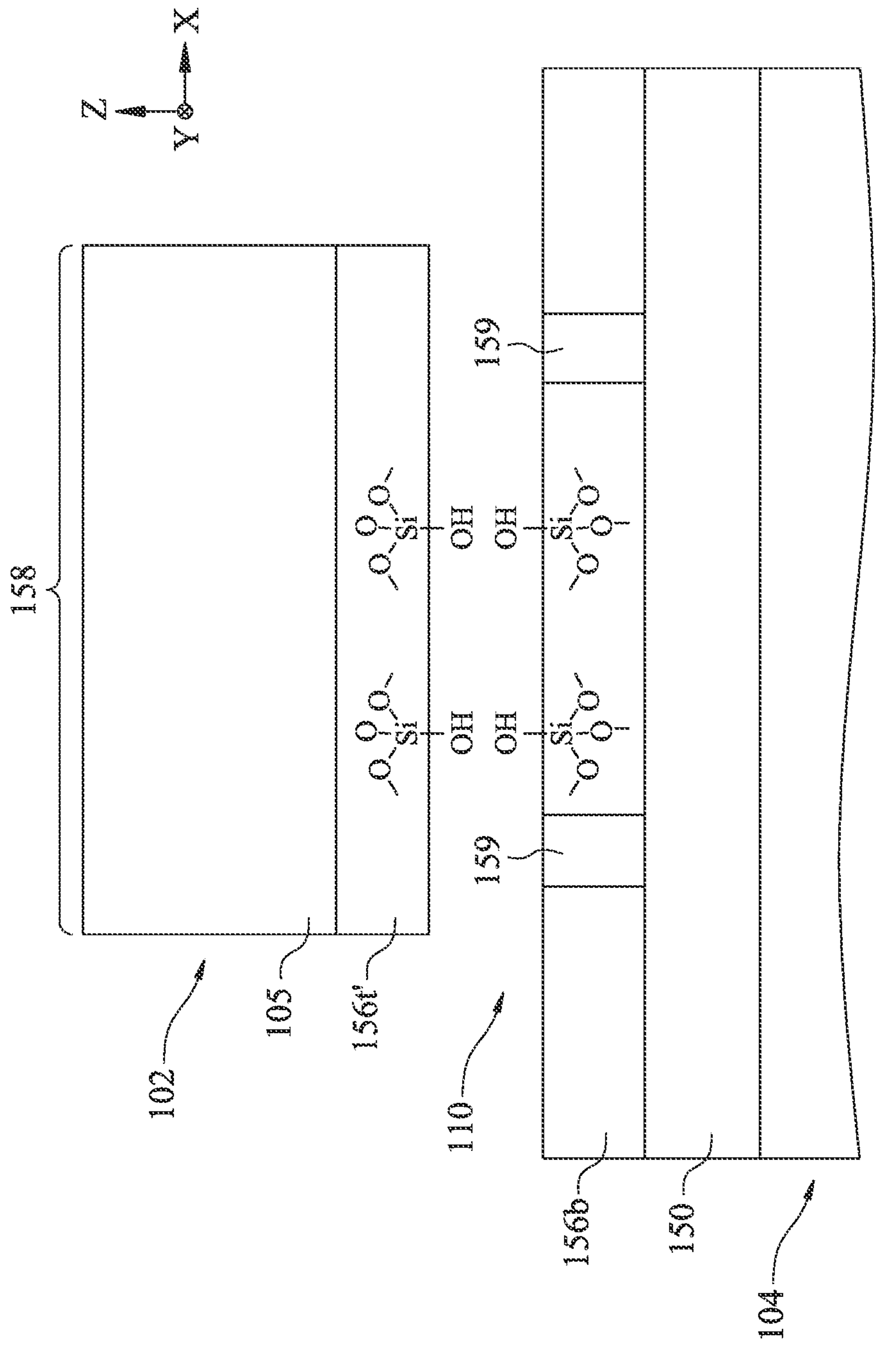
FIGS. 2A-2C are cross-sectional diagrams illustrating the dielectric-to-dielectric bonding interface shown in FIG. 1 in accordance with some embodiments.
Figure 2B:
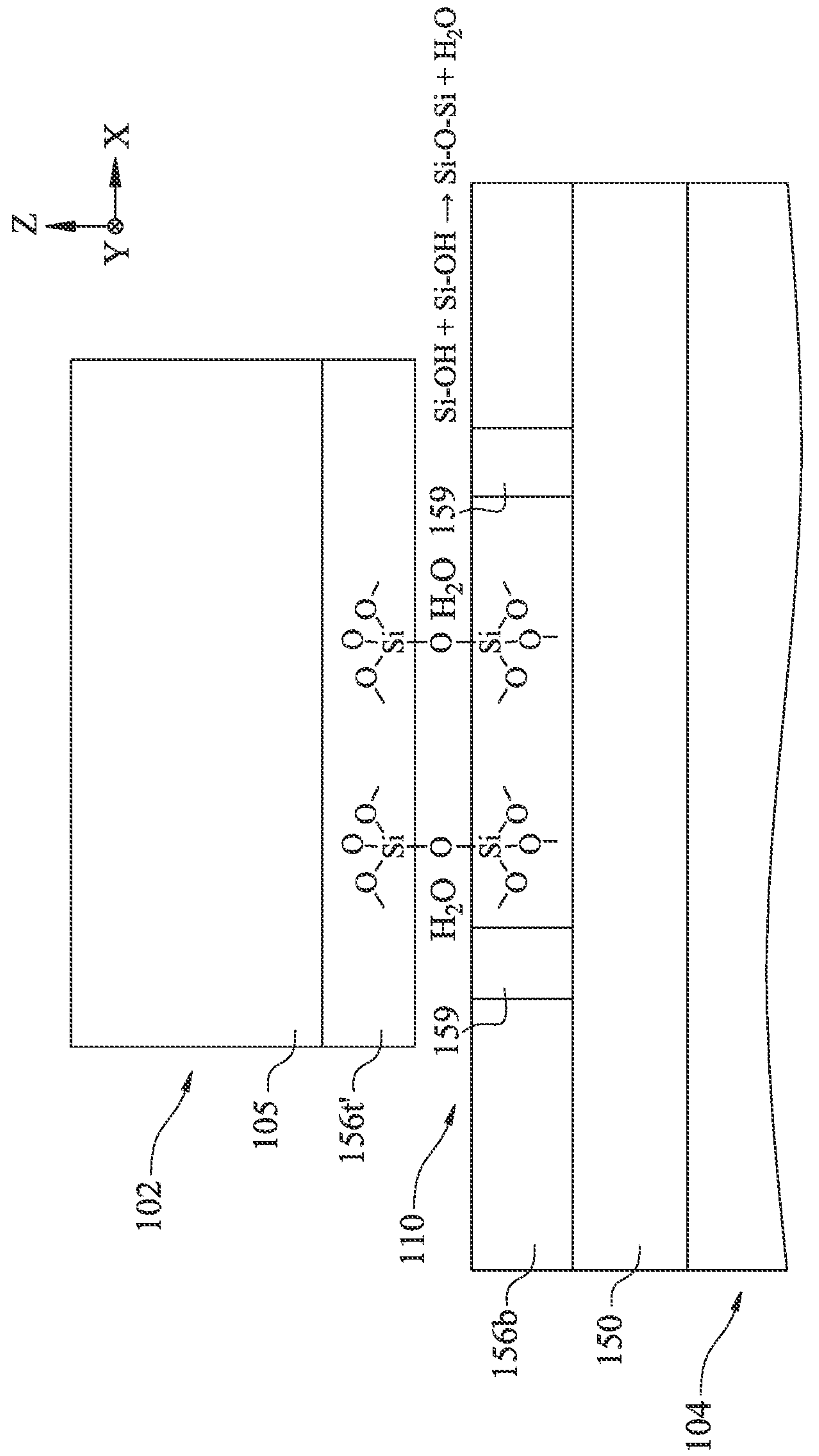
Figure 2C:
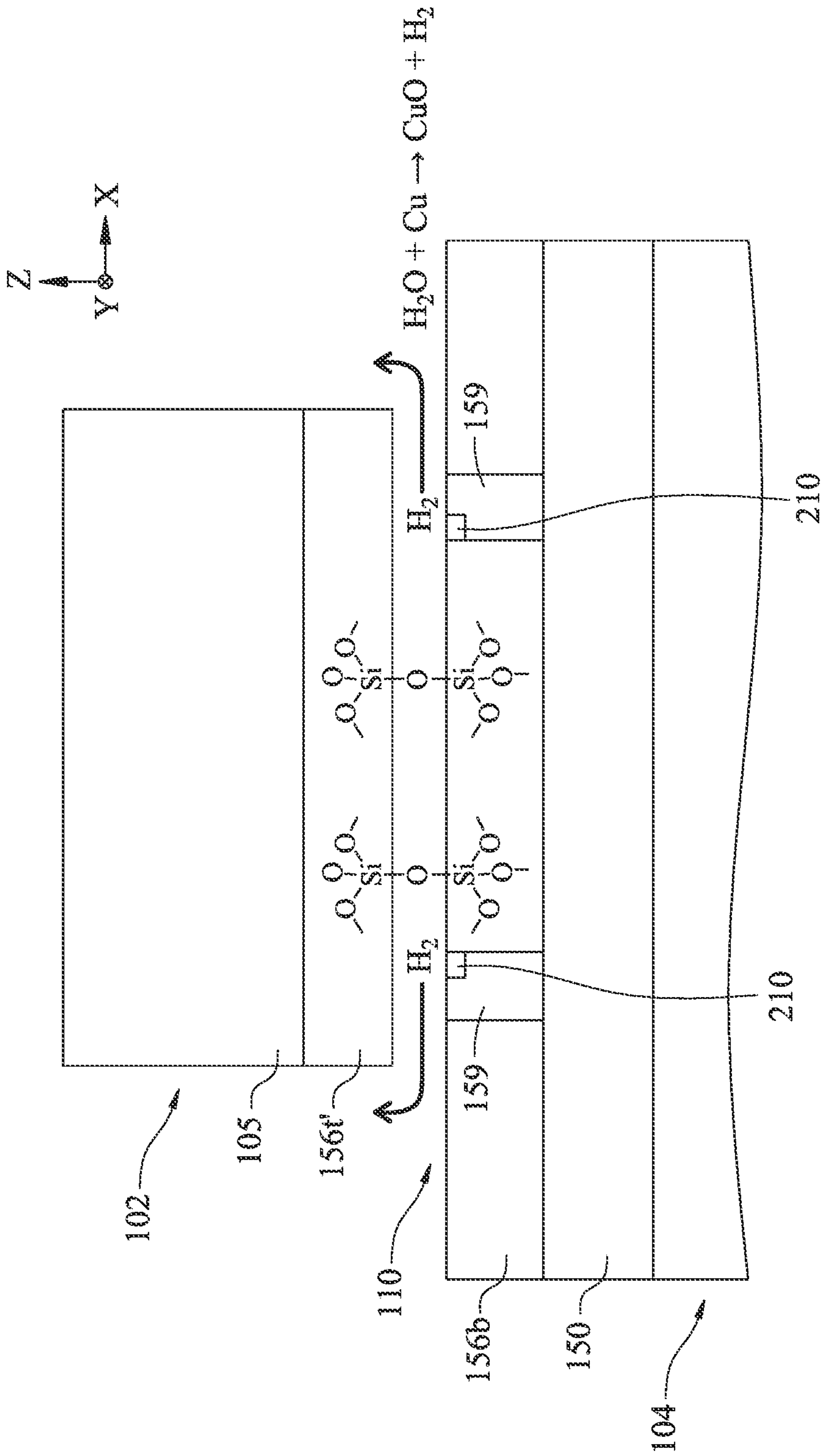

FIGS. 2A-2C are cross-sectional diagrams illustrating the dielectric-to-dielectric bonding interface 110 shown in FIG. 1 in accordance with some embodiments. It should be understood that FIGS. 2A-2C are illustrative and not drawn to scale. As shown in FIG. 2A, the dummy die 102 and the bottom die 104 are aligned in the X-Y plane. In the example shown in FIGS. 2A-2C, the bonding layers **156*b* and 156*t*'** are made of silicon dioxide. Each silicon atom is covalently bonded to four oxygen atoms in a tetrahedral manner. Each oxygen atom is bonded to two silicon atoms. That is, each oxygen atom is shared by two silicon atoms.

As shown in FIG. 2A, for silicon atoms in the bonding layer **156*t*' that are in proximity to the bottom surface of the bonding layer 156*t*', silanol groups (i.e., Si—OH) are formed. Similarly, for silicon atoms in the bonding layer 156*b* that are in proximity to the top surface of the bonding layer 156*b***, silanol groups (i.e., Si—OH) are formed.

As shown in FIG. 2B, as the bonding layer **156*t*' and the bonding layer 156*b* get closer and eventually physically in contact with each other (the gap between the bonding layers 156*t*' and 156*b* are exaggerated for better illustration), silanol groups (i.e., Si—OH) polymerize to siloxane groups (i.e., Si—O—Si) and water in accordance with Si—OH+Si—OH→Si—O—Si+$H_2O$. The conversion of silanol groups to siloxane groups increases the bonding energy between the bonding layers 156*b* and 156*t*'. In some implementations, the bonding layers 156*b* and 156*t*' are preprocessed using some pretreatment techniques such as hydration, CMP, and cleaning to make the surfaces of the bonding layers 156*b* and 156*t*' very flat, smooth, and clean in order for the bonding to be successful. In some implementations, the dummy die 102 are picked, aligned in the X-Y plane, lower, placed, and pressed on the bottom die 104** by a pick-and-place system. In some implementations, an annealing process at an elevated temperature may follow.

As mentioned above, water is generated as a byproduct of the polymerization process, and water-containing voids may be formed at the dielectric-to-dielectric bonding interface 110. The water-containing voids can reduce the bonding force at the dielectric-to-dielectric bonding interface 110 and even cause chip delamination in some cases. To address issues related to water-containing voids, the dummy metal pads 159 are introduced. The dummy metal pads 159 are not connected to any semiconductor devices in the bottom die 104. As mentioned above, in one example, the dummy metal pads 159 are made of copper. In some embodiments, the dummy metal pads 159 are formed at the same time as the hybrid bonding metal pad **158*b* shown in FIG. 1. In other words, the dummy metal pads 159 and the hybrid bonding metal pad 158*b* are defined using the same mask, and no additional steps are introduced because both the dummy metal pads 159 and the hybrid bonding metal pad 158*b* are formed simultaneously in the bonding layer 156*b***.

As shown in FIG. 2C, because of the dummy metal pads 159 made of copper in this example, copper oxidation occurs in accordance with $H_2O$+Cu→CuO+$H_2$. That is, the copper atoms in the dummy metal pads 159 are oxidized to become copper oxide (CuO) 210, and gaseous hydrogen ($H_2$) is generated. In some implementations, the gaseous hydrogen can diffuse and exit the dielectric-to-dielectric bonding interface 110, as shown by the arrows in FIG. 2C. In other implementations, the gaseous hydrogen can be removed from the dielectric-to-dielectric bonding interface 110 using an annealing process. As a result, the water-containing voids are reduced or even eliminated, therefore enhancing the bonding force between the bonding layers **156*b* and 156*t*'. Since the dummy metal pads 159 are not used for any electrical connection, the copper oxide 210 does not affect any electrical connections or functionality of the bottom die 104**.

Figure 3:
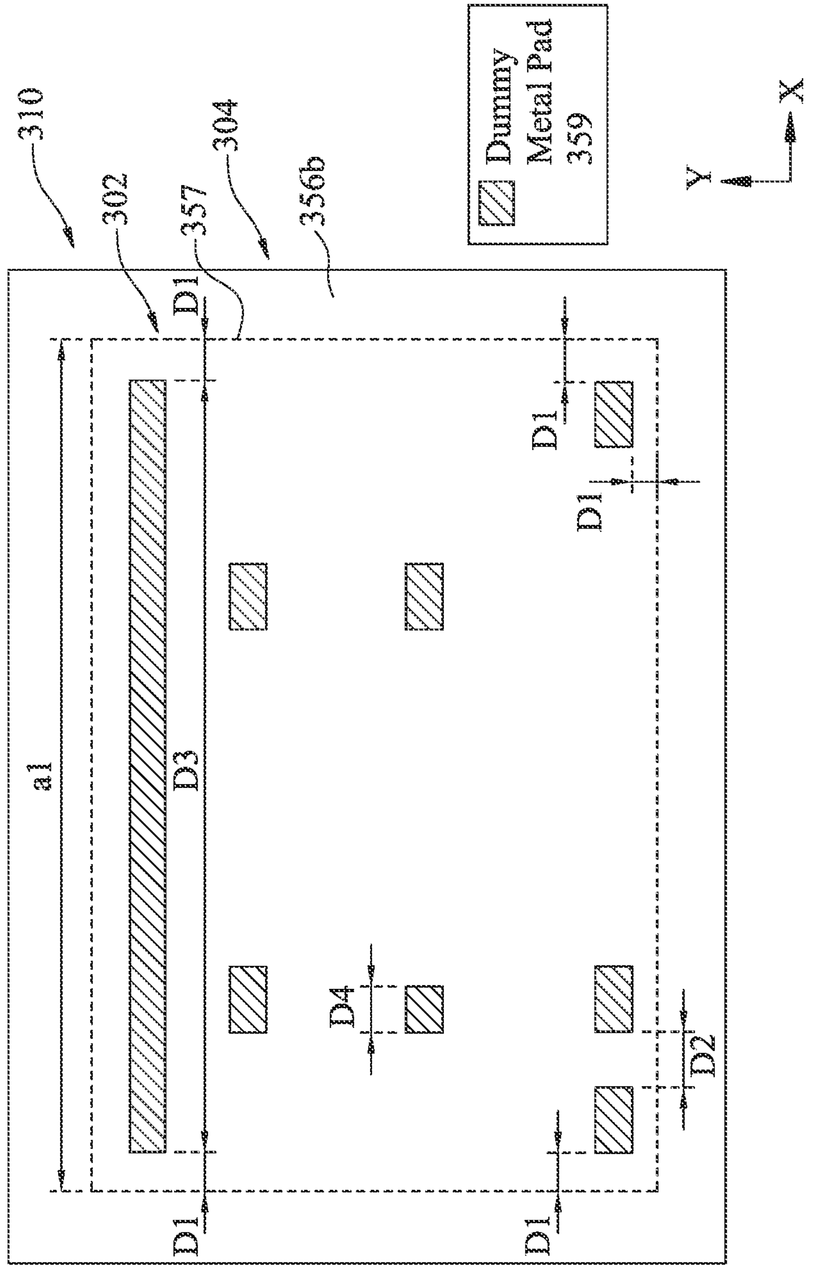
FIG. 3 is a diagram illustrating an example top view of dummy metal pads in accordance with some embodiments.

FIG. 3 is a diagram illustrating an example top view of dummy metal pads in accordance with some embodiments. In the example shown in FIG. 3, a top die 302 is bonded to a bottom die 304 at a dielectric-to-dielectric bonding interface 310. The bottom die 304 is larger than the top die 302 in the horizontal plane (i.e., the X-Y plane). The top die 302 has an outline 357 (denoted in dashed line in FIG. 3) after the alignment between the top die 302 and the bottom die 304.

As shown in FIG. 3, the bottom die 304 has a bonding layer **356*b* at its top surface, and there are dummy metal pads 359 formed in the bonding layer 356*b*. Those dummy metal pads 359 are made of copper in some embodiments. As explained above, those dummy metal pads 359 can be oxidized in accordance with $H_2O$+Cu→CuO+$H_2$, therefore reducing or eliminating water-containing voids and enhancing the bonding force at the dielectric-to-dielectric bonding interface 310**.

The dummy metal pads 359 can be arranged in the X-Y plane freely as desired, as long as certain rules are followed. In accordance with the first rule, the distance D1 between a dummy metal pad 359 and the outline 357 in the X-direction or the Y-direction is larger than a first length threshold. In one embodiment, the first length threshold is 0.5 μm. Because the alignment between the top die 302 and the bottom die 304 has some shift errors, the first rule can create some safe margin such that the dummy metal pads 359 would not be located outside the outline 357 when the top die 302 is bonded to the bottom die 304.

In accordance with the second rule, the distance D2 between two dummy metal pads 359 in the X-direction or in the Y-direction is equal to or larger than a second length threshold. In one embodiment, the second length threshold is 0.1 μm. In another embodiment, the second length threshold is 0.02 μm. The second rule can make sure that any two dummy metal pads 359 would not be too close, exceeding the resolution limits of a lithography process.

In accordance with the third rule, the longest feature D3 of any dummy metal pad 359 is smaller than a third length threshold. In the example shown in FIG. 3, the outline of the top die 302 is rectangular with a long side extending in the X-direction and having a length a1. As shown in FIG. 3, D3 is equal to (a1−2D1). In one embodiment where the first length threshold is 0.5 μm, the third length threshold is (a1−1) in μm. As such, the third rule can ensure that no dummy metal pads 359 would be too long to be accommodated at the dielectric-to-dielectric bonding interface 310.

In accordance with the fourth rule, the length D4 of any dummy metal pad 359, in the X-direction or in the Y-direction, is equal to or larger than a fourth length threshold. In one embodiment, the fourth length threshold is 0.1 μm. In another embodiment, the fourth length threshold is 0.02 μm. The fourth rule can make sure that any dummy metal pads 359 would not be too small to exceed the resolution limits of a lithography process.

In accordance with the fifth rule, the ratio R1 of the area of dummy metal pads 359 to the area of the top die 302 (i.e., the area defined by the outline 357) is between a first percentage threshold and a second percentage threshold. In one embodiment, the first percentage threshold is 0.01%, whereas the second percentage threshold is 90%. In another embodiment, the first percentage threshold is 0.1%, whereas the second percentage threshold is 85%. In yet another embodiment, the first percentage threshold is 1%, whereas the second percentage threshold is 80%. In still another embodiment, the first percentage threshold is 5%, whereas the second percentage threshold is 75%. In yet another embodiment, the first percentage threshold is 10%, whereas the second percentage threshold is 70%. The fifth rule can make sure that the overall area of the dummy metal pads 359 would be neither too small (which diminishes the capability of the dummy metal pads 359 to reduce or even eliminate the water-containing voids) nor too large (which diminishes the bonding forces since the dielectric area becomes small).

It should be understood that these rules set forth above are examples, and other rules may be applied to the dummy metal pads. Moreover, although the top die 302 is smaller than the bottom die 304 in the example shown in FIG. 3, it should be understood that the top die 302 may have the same size as the bottom die 304 in some embodiments and may be larger than the bottom die 304 in other embodiments. Those rules set forth above are also applicable to those embodiments.

FIGS. 4-9 are diagrams illustrating example plan views of dummy metal pads in accordance with some embodiments. As mentioned above, the dummy metal pad 359 can have various patterns formed in the bonding layer **356*b* within the outline 357, complying with rules such as the five rules set forth above. It should be understood that the examples shown in FIGS. 4-9** are exemplary rather than limiting, and other patterns can be employed in other embodiments accordingly.

Figure 4:
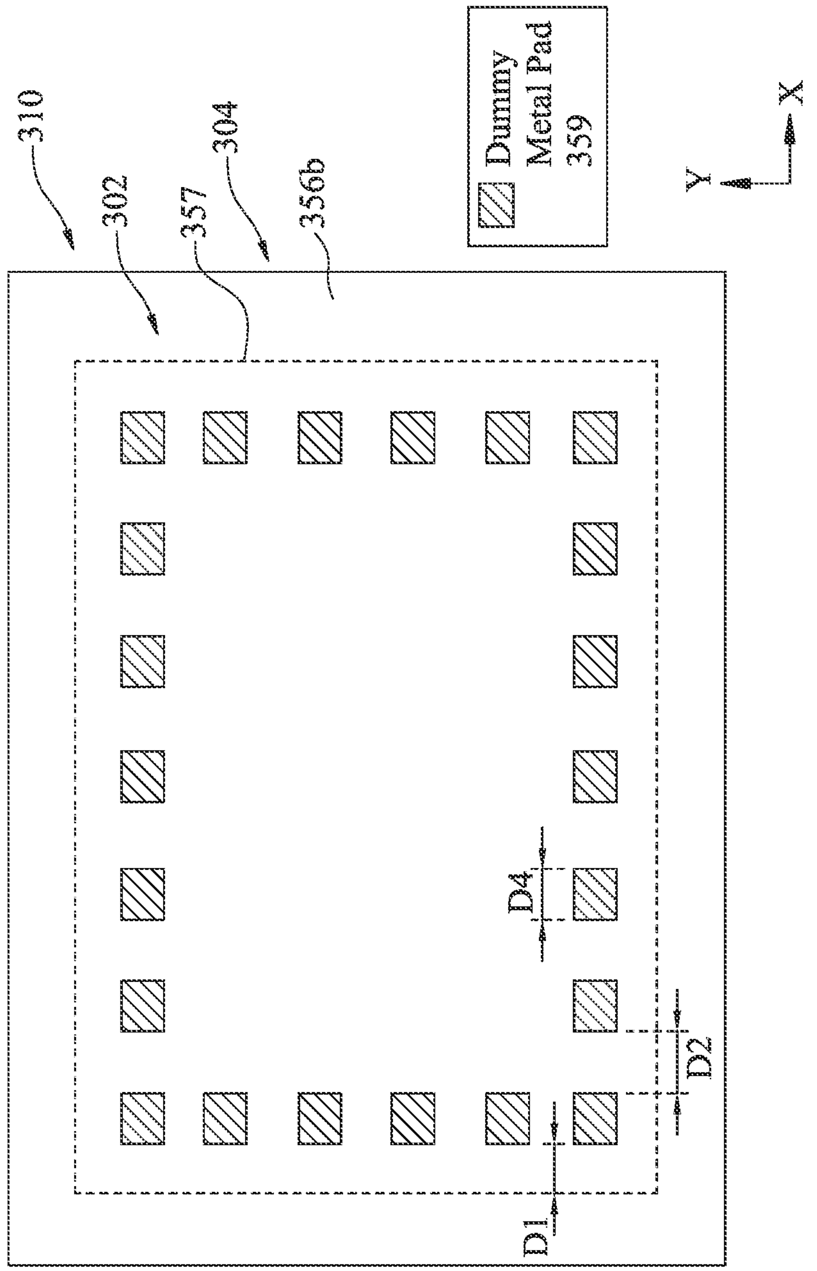
FIGS. 4-9 are diagrams illustrating example plan views of dummy metal pads in accordance with some embodiments.

In the example shown in FIG. 4, each of the dummy metal pads 359 has the same size and the same shape (i.e., a rectangular shape). The dummy metal pads 359 are located at the periphery of the outline 357 of the top die 302, in compliance with at least the first rule (i.e., D1 is larger than the first length threshold), the second rule (i.e., D2 is equal to or larger than the second length threshold), and the fourth rule (i.e., D4 is equal to or larger than the fourth length threshold). Since the dummy metal pads 359 are located at the periphery of the outline 357, water-containing voids can be eliminated at least at the periphery of the bottom surface of the top die 302, thereby achieving an enhanced bonding force at least at the periphery of the bottom surface of the top die 302 where chip delamination is more likely to occur.

Figure 5:
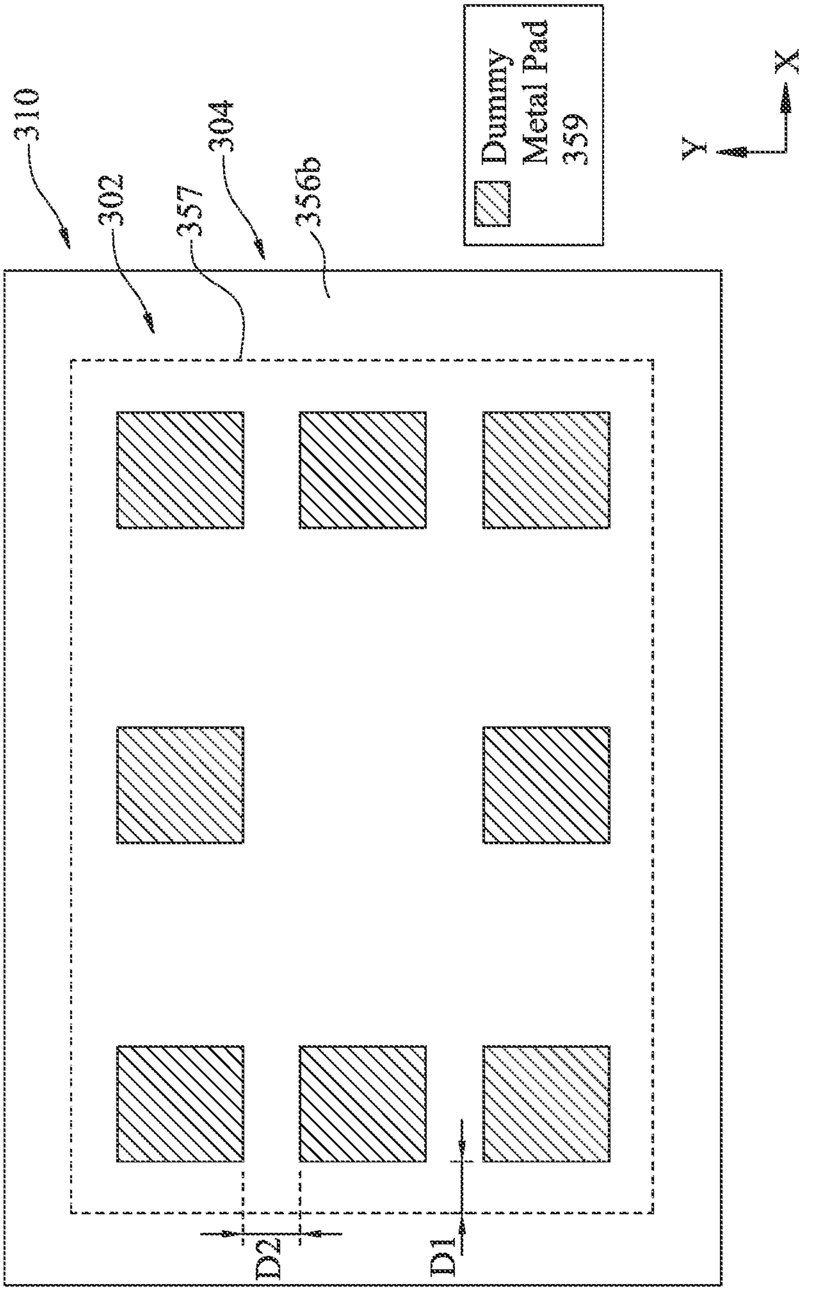

In the example shown in FIG. 5, each of the dummy metal pads 359 has the same size and the same shape (i.e., a rectangular shape). The dummy metal pads 359 are also located at the periphery of the outline 357 of the top die 302. Compared to the example shown in FIG. 4, each of the dummy metal pads has a larger size and fewer dummy metal pads are formed. Likewise, the dummy metal pads follow at least the first rule (i.e., D1 is larger than the first length threshold), the second rule (i.e., D2 is equal to or larger than the second length threshold). Since the dummy metal pads 359 are located at the periphery of the outline 357, water-containing voids can be eliminated at least at the periphery of the bottom surface of the top die 302, thereby achieving an enhanced bonding force at least at the periphery of the bottom surface of the top die 302 where chip delamination is more likely to occur.

Figure 6:
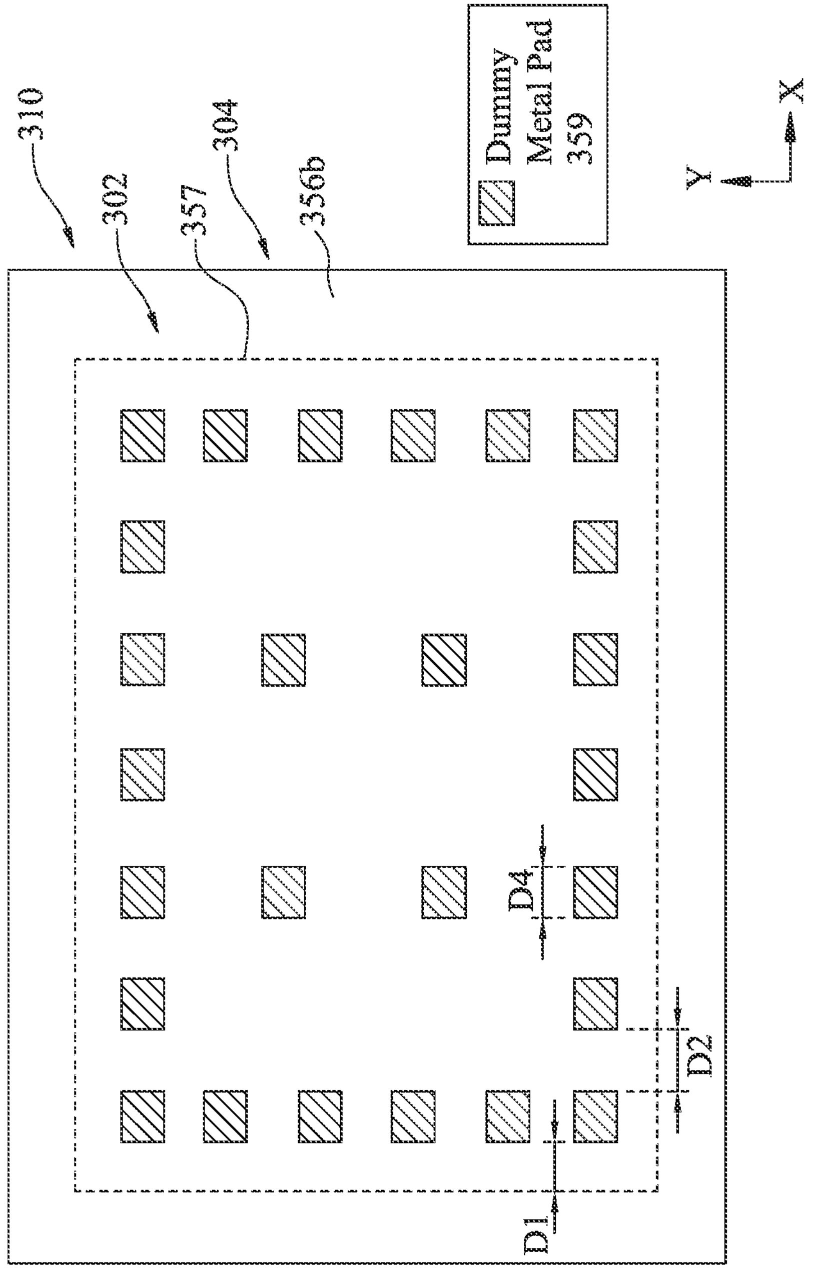

In the example shown in FIG. 6, each of the dummy metal pads 359 has the same size and the same shape (i.e., a rectangular shape). The dummy metal pads 359 are located at both the periphery and the central region of the outline 357 of the top die 302. The dummy metal pads 359 are in compliance with at least the first rule (i.e., D1 is larger than the first length threshold), the second rule (i.e., D2 is equal to or larger than the second length threshold), and the fourth rule (i.e., D4 is equal to or larger than the fourth length threshold). Compared to the dummy metal pads 359 shown in FIG. 4, the dummy metal pads 359 provide a further enhanced bonding force at the central region of the outline 357 of the top die 302.

Figure 7:
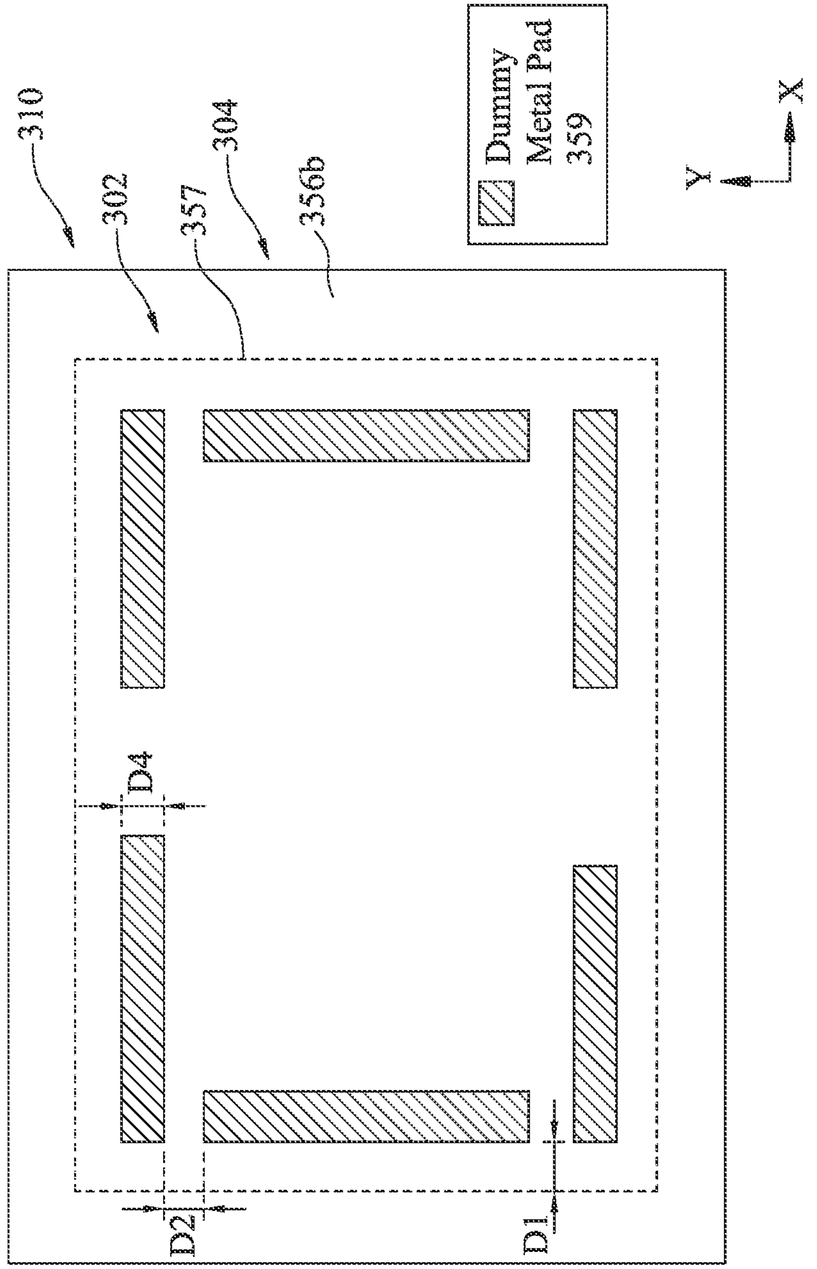

In the example shown in FIG. 7, each of the dummy metal pads 359 has an elongated shape and extends either in the X-direction or in the Y-direction. The dummy metal pads 359 are located at the periphery of the outline 357 of the top die 302, in compliance with at least the first rule (i.e., D1 is larger than the first length threshold), the second rule (i.e., D2 is equal to or larger than the second length threshold), and the fourth rule (i.e., D4 is equal to or larger than the fourth length threshold). Since the dummy metal pads 359 are located at the periphery of the outline 357, water-containing voids can be eliminated at least at the periphery of the bottom surface of the top die 302, thereby achieving an enhanced bonding force at least at the periphery of the bottom surface of the top die 302 where chip delamination is more likely to occur. The elongated dummy metal pads 359 can be regarded as an alternative to multiple smaller dummy metal pads (e.g., the ones shown in FIG. 4) arranged in a row.

Figure 8:
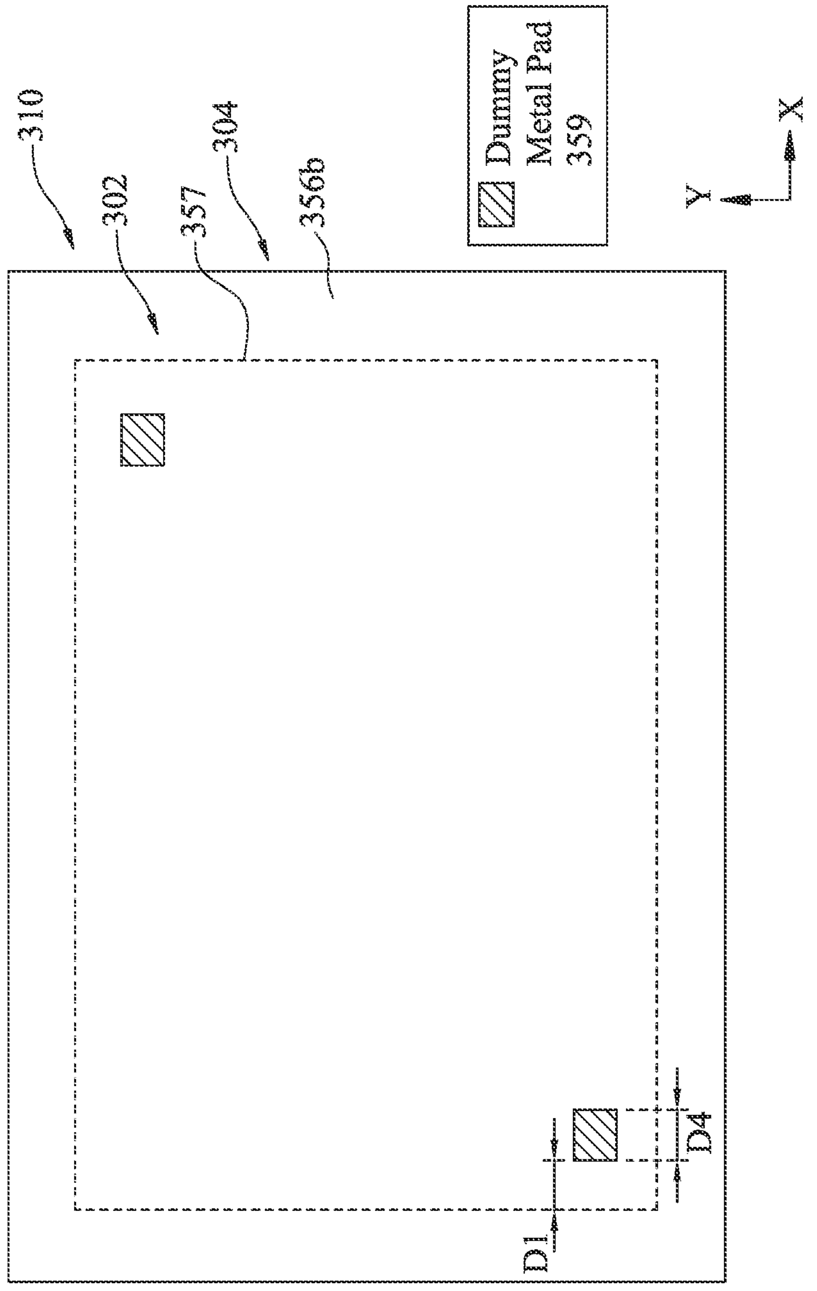

In the example shown in FIG. 8, there are two dummy metal pads 359 formed at two opposite corners of the outline 357 of the top die 302. The two dummy metal pads 359 both have a rectangular shape. The dummy metal pads 359 are located at the periphery of the outline 357 of the top die 302, in compliance with at least the first rule (i.e., D1 is larger than the first length threshold), the fourth rule (i.e., D4 is equal to or larger than the fourth length threshold), and the fifth rule (i.e., the ratio R1 is above the first percentage threshold). The advantages of this pattern shown in FIG. 8 include at least that the overall area of the dummy metal pads 359 is smaller than those shown in FIGS. 4-8, while still providing an enhanced bonding force at least at the periphery of the bottom surface of the top die 302 where chip delamination is more likely to occur. In some alternative embodiments, the dummy metal pads 359 can be formed at four, not two, corners of the outline 357 of the top die 302.

Figure 9:
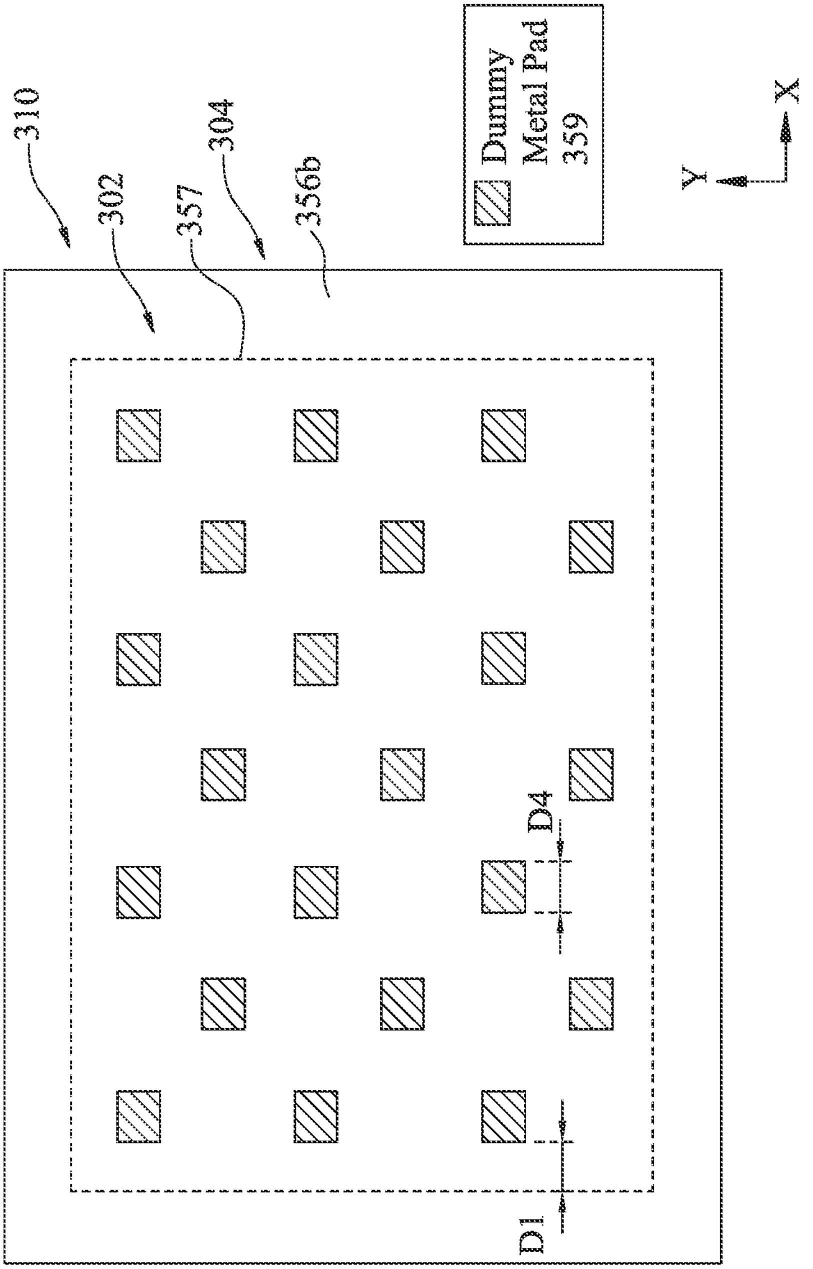

In the example shown in FIG. 9, each of the dummy metal pads 359 has the same size and the same shape (i.e., a rectangular shape). The dummy metal pads 359 are evenly distributed within the outline 357 of the top die 302, in compliance with at least the first rule (i.e., D1 is larger than the first length threshold) and the fourth rule (i.e., D4 is equal to or larger than the fourth length threshold). The advantages of this pattern shown in FIG. 9 include at least that the enhanced bonding force is provided evenly to the whole area within the outline 357 of the top die 302 and that the second rule (i.e., D2 is equal to or larger than the second length threshold) becomes easier to be in compliance with.

Again, it should be understood that the patterns shown in FIGS. 4-9 are exemplary rather than limiting, and other patterns may be employed in other embodiments.

Figure 10:
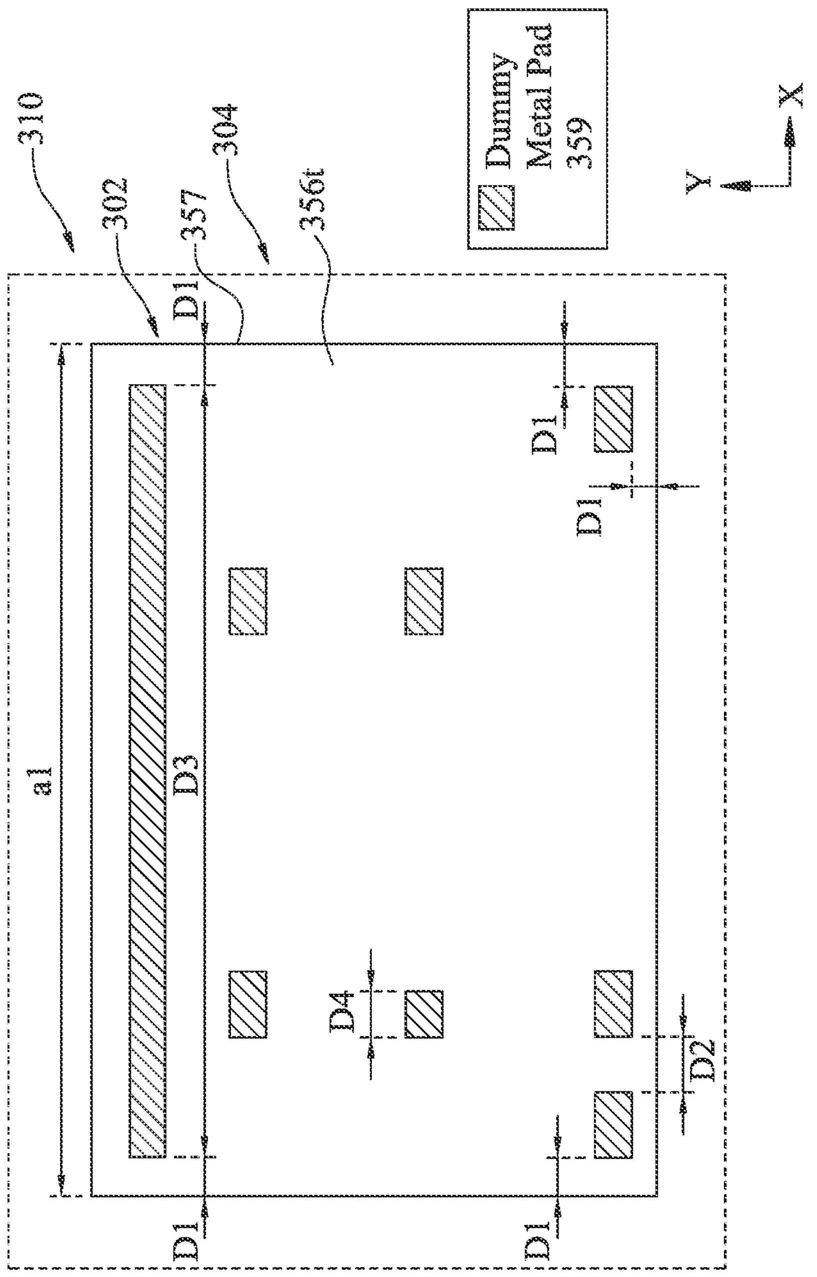
FIG. 10 is a diagram illustrating an example bottom view of dummy metal pads in accordance with some embodiments.

FIG. 10 is a diagram illustrating an example bottom view of dummy metal pads in accordance with some embodiments. Different from the example shown in FIG. 3, the dummy metal pads 359 are formed in the bonding layer **356*t* formed at the bottom surface of the top die 302. The top die 302 is bonded to a bottom die 304 at a dielectric-to-dielectric bonding interface 310. The bottom die 304 is larger than the top die 302 in the horizontal plane (i.e., the X-Y plane). The top die 302 has an outline 357 (denoted in dashed line in FIG. 10) after the alignment between the top die 302 and the bottom die 304**.

Likewise, the dummy metal pads 359 can be arranged in the X-Y plane freely as desired, as long as certain rules are followed. In accordance with the first rule, the distance D1 between a dummy metal pad 359 and the outline 357 in the X-direction or the Y-direction is larger than a first length threshold. In one embodiment, the first length threshold is 0.5 μm. Because the alignment between the top die 302 and the bottom die 304 has some shift errors, the first rule can create some safe margin such that the dummy metal pads 359 would not be located outside the outline 357 when the top die 302 is bonded to the bottom die 304.

In accordance with the second rule, the distance D2 between two dummy metal pads 359 in the X-direction or in the Y-direction is equal to or larger than a second length threshold. In one embodiment, the second length threshold is 0.1 μm. In another embodiment, the second length threshold is 0.02 μm. The second rule can make sure that any two dummy metal pads 359 would not be too close to exceed the resolution limits of a lithography process.

In accordance with the third rule, the longest feature D3 of any dummy metal pad 359 is smaller than a third length threshold. In the example shown in FIG. 3, the outline of the top die 302 is rectangular with a long side extending in the X-direction and having a length a1. As shown in FIG. 3, D3 is equal to (a1−2D1). In one embodiment where the first length threshold is 0.5 μm, the third length threshold is (a1−1) in μm. As such, the third rule can ensure that no dummy metal pads 359 would be too long to be accommodated at the dielectric-to-dielectric bonding interface 310.

In accordance with the fourth rule, the length D4 of any dummy metal pad 359, in the X-direction or in the Y-direction, is equal to or larger than a fourth length threshold. In one embodiment, the fourth length threshold is 0.1 μm. In another embodiment, the fourth length threshold is 0.02 μm. The fourth rule can make sure that any dummy metal pads 359 would not be too small to exceed the resolution limits of a lithography process.

In accordance with the fifth rule, the ratio R1 of the area of dummy metal pads 359 to the area of the top die 302 (i.e., the area defined by the outline 357) is between a first percentage threshold and a second percentage threshold. In one embodiment, the first percentage threshold is 0.01%, whereas the second percentage threshold is 90%. In another embodiment, the first percentage threshold is 0.1%, whereas the second percentage threshold is 85%. In yet another embodiment, the first percentage threshold is 1%, whereas the second percentage threshold is 80%. In still another embodiment, the first percentage threshold is 5%, whereas the second percentage threshold is 75%. In yet another embodiment, the first percentage threshold is 10%, whereas the second percentage threshold is 70%. The fifth rule can make sure that the overall area of the dummy metal pads 359 would be neither too small (which diminishes the capability of the dummy metal pads 359 to reduce or even eliminate the water-containing voids) nor too large (which diminishes the bonding forces since the dielectric area becomes small).

It should be understood that these rules set forth above are examples, and other rules may be applied to the dummy metal pads. Moreover, although the top die 302 is smaller than the bottom die 304 in the example shown in FIG. 10, it should be understood that the top die 302 may have the same size as the bottom die 304 in some embodiments and may be larger than the bottom die 304 in other embodiments. Those rules set forth above are also applicable to those embodiments accordingly.

Figure 11:
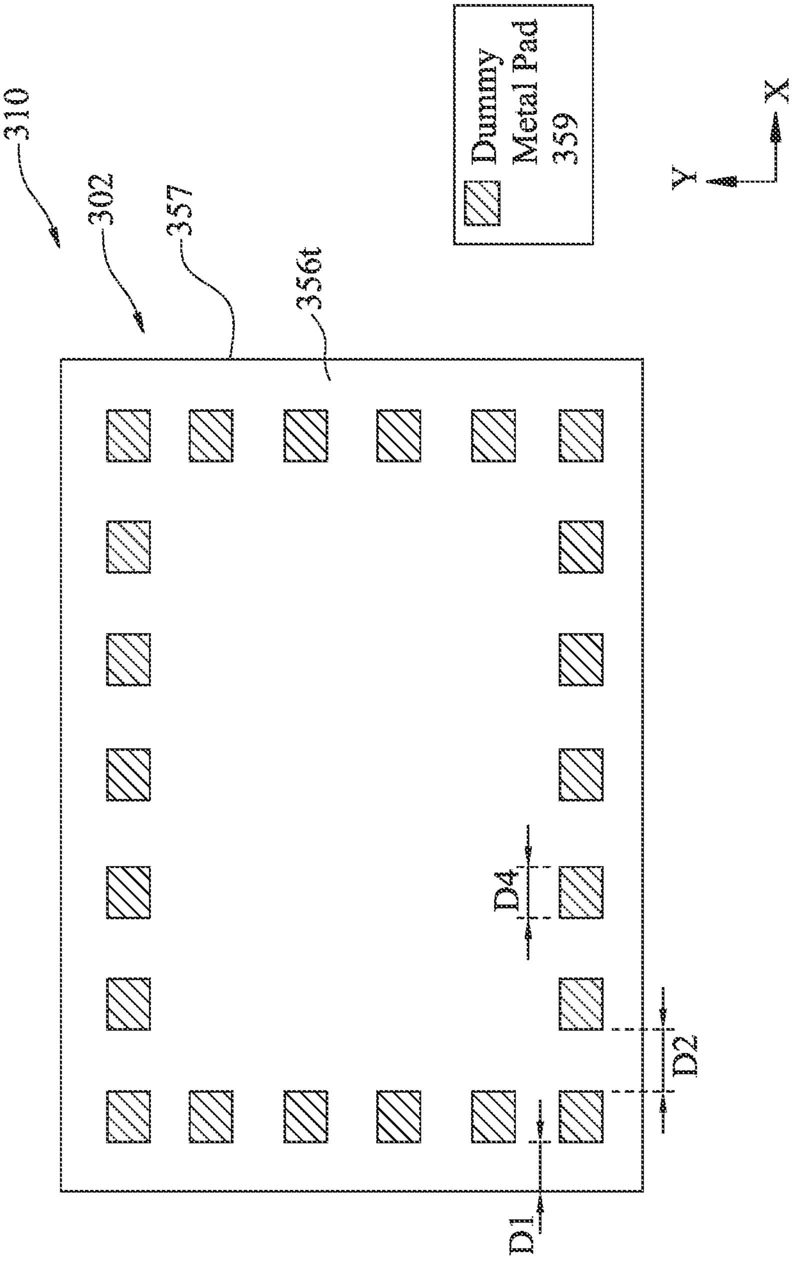
FIG. 11 is a diagram illustrating example plan views of dummy metal pads in accordance with some embodiments.

FIG. 11 is a diagram illustrating example plan views of dummy metal pads in accordance with some embodiments. As mentioned above, the dummy metal pad 359 can have various patterns formed in the bonding layer **356*t* within the outline 357**, complying with rules such as the five rules set forth above.

In the example shown in FIG. 11, each of the dummy metal pads 359 has the same size and the same shape (i.e., a rectangular shape). The dummy metal pads 359 are located at the periphery of the outline 357 of the top die 302, in compliance with at least the first rule (i.e., D1 is larger than the first length threshold), the second rule (i.e., D2 is equal to or larger than the second length threshold), and the fourth rule (i.e., D4 is equal to or larger than the fourth length threshold). Similarly, since the dummy metal pads 359 are located at the periphery of the outline 357, water-containing voids can be eliminated at least at the periphery of the bottom surface of the top die 302, thereby achieving an enhanced bonding force at least at the periphery of the bottom surface of the top die 302 where chip delamination is more likely to occur.

It should be understood that the other patterns similar to those illustrated in FIGS. 5-9 can also be employed for dummy metal pads formed in the bonding layer **356*t* in the top die 302. Again, it should be understood that the pattern shown in FIG. 11** and other patterns are exemplary rather than limiting, and additional patterns may be employed in other embodiments.

Figure 12:
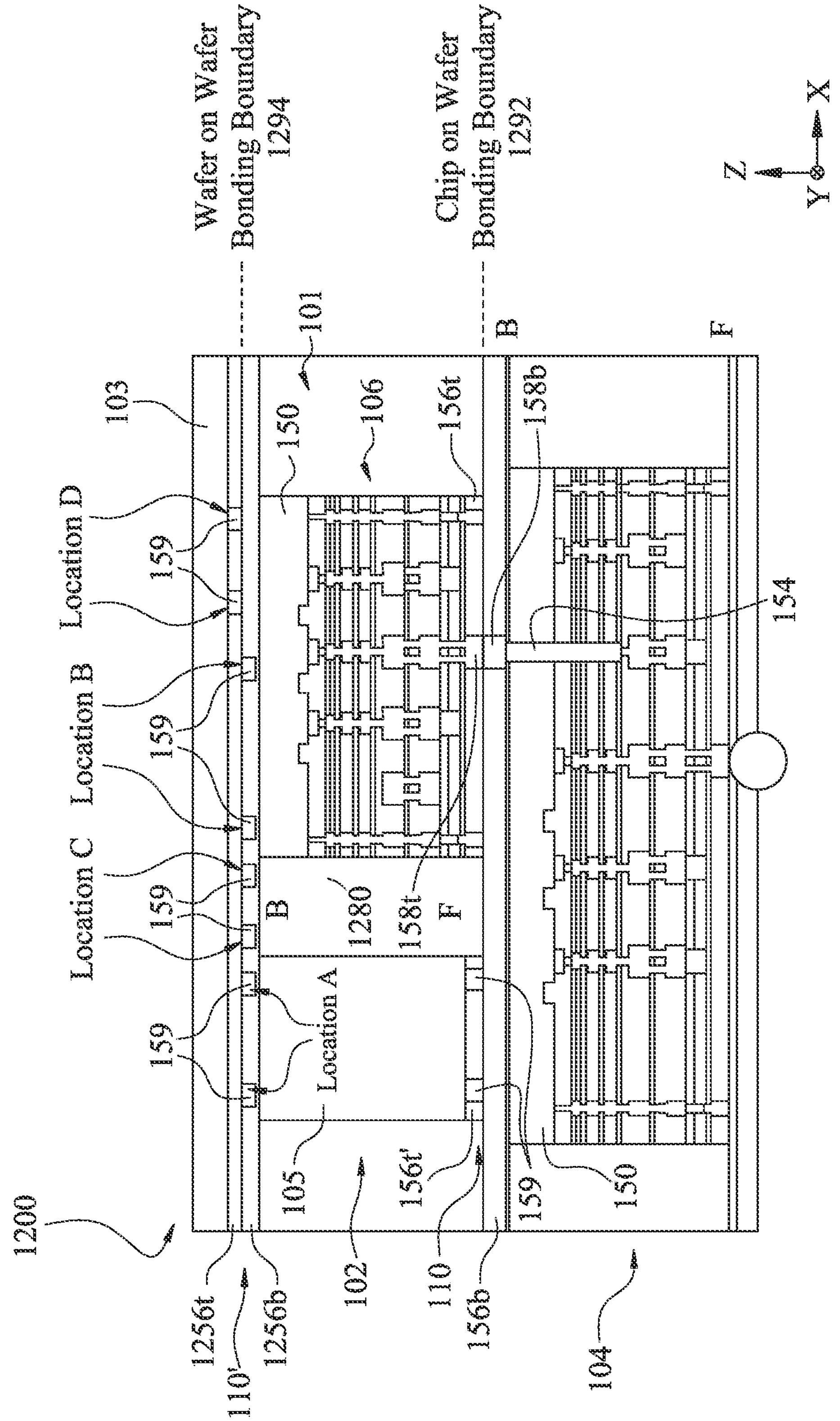
FIG. 12 is a cross-sectional diagram illustrating an example semiconductor package and potential places where dummy metal pads may be placed in accordance with some embodiments.

FIG. 12 is a cross-sectional diagram illustrating an example semiconductor package 1200 and potential places where dummy metal pads may be placed in accordance with some embodiments. The semiconductor package 1200 shown in FIG. 12 is identical to the semiconductor package 100 shown in FIG. 1 except that the dummy metal pads 159 are formed in the bonding layer **156*t*' instead of in the bonding layer 156*b*. At the dielectric-to-dielectric bonding interface 110, which can be considered as a chip on wafer bonding boundary 1292, the dummy metal pads can be formed in either the bonding layer 156*b* of the bottom die 104 (as shown in FIG. 1) or the bonding layer 156*t*' of the dummy die 102 (as shown in FIG. 12**).

Another difference is that the dummy metal pads can be formed in other locations in the semiconductor package 1200, which includes the SoIC die stack 101. For instance, the dummy metal pads can be formed at the dielectric-to-dielectric bonding interface 110' between a bonding layer **1256*b* ("b" stands for "bottom") formed on the top surface of the top die 106 and the top surface of the dummy die 102 and a bonding layer 1256*t* ("t" stands for "top") formed on the bottom surface of the carrier wafer 103**.

In one example, the dummy metal pads 159 can be formed in the bonding layer **1256*b* and at the top surface of the dummy die 102 ("Location A" shown in FIG. 12). In another example, the dummy metal pads 159 can be formed in the bonding layer 1256*b* and at the top surface of the top die 106 ("Location B" shown in FIG. 12). In yet another example, the dummy metal pads 159 can be formed in the bonding layer 1256*b* and at the top surface of the dielectric area 1280 ("Location C" shown in FIG. 12). It should be understood that the dummy metal pads 159** can be formed in one or more of the three locations, namely Location A, Location B, and Location C.

Alternatively, the dummy metal pads can also be formed in the bonding layer **1256*t*** instead of the bonding layer 1256*b*. In one example, the dummy metal pads 159 can be formed in the bonding layer 1256*t* over the top die 106 ("Location D" shown in FIG. 12). It should be understood that the locations shown in FIG. 12 are exemplary rather than limiting, and one of ordinary skill in the art should appreciate other variations and modifications.

Figure 13:
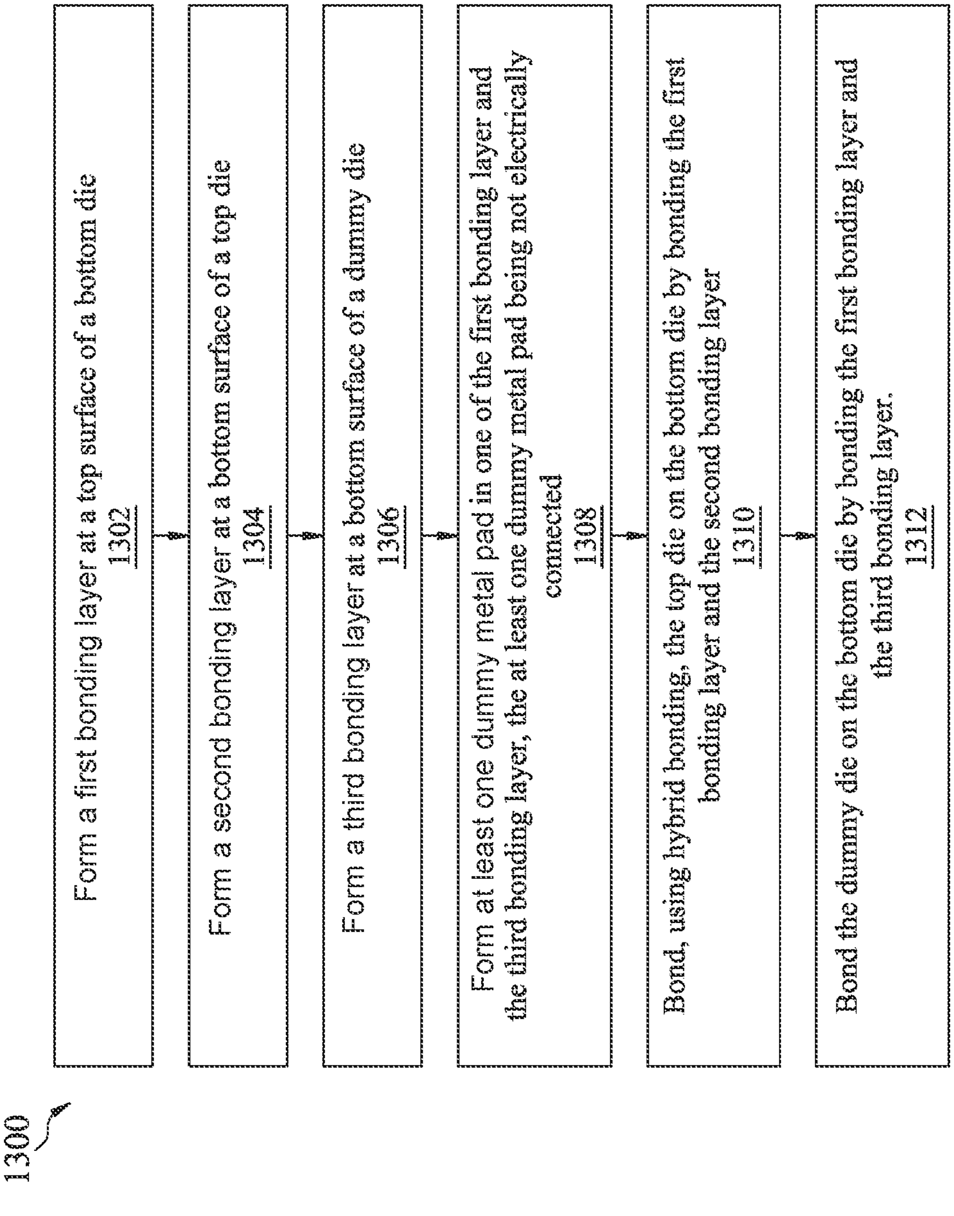
FIG. 13 is a flowchart illustrating an example method in accordance with some embodiments.

FIG. 13 is a flowchart illustrating an example method 1300 in accordance with some embodiments. In the example shown in FIG. 13, the method 1300 includes operations 1302, 1304, 1306, 1308, 1310, and 1312. Additional operations may be performed. Also, it should be understood that the sequence of the various operations discussed above with reference to FIG. 13 is provided for illustrative purposes, and as such, other embodiments may utilize different sequences. These various sequences of operations are to be included within the scope of embodiments.

At operation 1302, a first bonding layer (e.g., the bonding layer 156*b* shown in FIG. 1) is formed at a top surface of a bottom die (e.g., the bottom die 104 shown in FIG. 1). In one embodiment, the first bonding layer is made of silicon dioxide.

At operation 1304, a second bonding layer (e.g., the bonding layer 156*t* shown in FIG. 1) is formed at a bottom surface of a top die (e.g., the top die 106 shown in FIG. 1). In one embodiment, the second bonding layer is made of silicon dioxide.

At operation 1306, a third bonding layer (e.g., the bonding layer 156*t*' shown in FIG. 1) is formed at a bottom surface of a dummy die (e.g., the dummy die 102 shown in FIG. 1). In one embodiment, the third bonding layer is made of silicon dioxide.

At operation 1308, at least one dummy metal pad (e.g., the dummy metal pads 159 shown in FIG. 1) is formed in one of the first bonding layer and the third bonding layer. The at least one dummy metal pad is not electrically connected. In one embodiment, the at least one dummy metal pad is made of copper.

At operation 1310, the top die is bonded, using hybrid bonding, on the bottom die by bonding the first bonding layer and the second bonding layer.

At operation 1312, the dummy die is bonded on the bottom die by bonding the first bonding layer and the third bonding layer.

In accordance with some aspects of the disclosure, a semiconductor package is provided. The semiconductor package includes: a bottom die having a first bonding layer formed at a top surface of the bottom die; a top die on the bottom die, wherein the top die comprises a second bonding layer formed at a bottom surface of the top die, and the top die is bonded to the bottom die by bonding the first bonding layer and the second bonding layer using hybrid bonding; a dummy die on the bottom die and lateral to the top die, wherein the dummy die comprises a third bonding layer formed at a bottom surface of the dummy die, and the dummy die is bonded to the bottom die by bonding the first bonding layer and the third bonding layer; and at least one dummy metal pad formed in one of the first bonding layer and the third bonding layer and not electrically connected.

In accordance with some aspects of the disclosure, a semiconductor package is provided. The semiconductor package includes: a first die having a first bonding layer formed at a top surface of the first die; a second die on the first die, wherein the second die comprises a second bonding layer formed at a bottom surface of the second die, and the second die is bonded to the first die by bonding the first bonding layer and the second bonding layer; and at least one dummy metal pad formed in one of the first bonding layer and the second bonding layer, wherein the at least one dummy metal pad is not electrically connected.

In accordance with some aspects of the disclosure, a method is provided. The method includes the following steps: forming a first bonding layer at a top surface of a bottom die; forming a second bonding layer at a bottom surface of a top die; forming a third bonding layer at a bottom surface of a dummy die; forming at least one dummy metal pad in one of the first bonding layer and the third bonding layer, the at least one dummy metal pad being not electrically connected; bonding, using hybrid bonding, the top die on the bottom die by bonding the first bonding layer and the second bonding layer; and bonding the dummy die on the bottom die by bonding the first bonding layer and the third bonding layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package comprising:

a bottom die having a first bonding layer formed at a top surface of the bottom die;

a top die on the bottom die, wherein the top die comprises a second bonding layer formed at a bottom surface of the top die, and the top die is bonded to the bottom die by bonding the first bonding layer and the second bonding layer using hybrid bonding;

a dummy die on the bottom die and lateral to the top die, wherein the dummy die comprises a third bonding layer formed at a bottom surface of the dummy die, and the dummy die is bonded to the bottom die by bonding the first bonding layer and the third bonding layer; and at least one dummy metal pad formed, within an overlapping region between the dummy die and the bottom die, in the third bonding layer and not electrically connected, wherein the at least one dummy metal pad contacts a dielectric of the first bonding layer of the bottom die.

2. The semiconductor package of claim 1, wherein the first bonding layer, the second bonding layer, and the third bonding layer are made of silicon dioxide.

3. The semiconductor package of claim 2, wherein the at least one dummy metal pad is made of copper.

4. The semiconductor package of claim 1, wherein at least one first hybrid bonding metal pad is formed in the first bonding layer, at least one second hybrid bonding metal pad is formed in the second bonding layer, and the first hybrid bonding metal pad is in contact with the second hybrid bonding metal pad.

5. The semiconductor package of claim 4, wherein the at least one first hybrid bonding metal pad and the at least one dummy metal pad are formed simultaneously.

6. The semiconductor package of claim 3, wherein the at least one dummy metal pad is configured to reduce water-containing voids.

7. The semiconductor package of claim 1, wherein a first distance between the at least one dummy metal pad and an outline of the dummy die in a first horizontal direction is larger than 0.5 μm.

8. The semiconductor package of claim 1, wherein the at least one dummy metal pad includes a plurality of dummy metal pads, and a second distance between any two of the plurality of dummy metal pads in a first horizontal direction is equal to or larger than 0.1 μm.

9. The semiconductor package of claim 1, wherein the at least one dummy metal pad comprises more than 10% of an area of the second bonding layer, and less than 70% of the area of the second bonding layer.

10. A semiconductor package comprising:

a first die having a first bonding layer formed at a top surface of the first die;

a second die on the first die, wherein the second die comprises a second bonding layer formed at a bottom surface of the second die, and the second die is bonded to the first die by bonding the first bonding layer and the second bonding layer; and at least one dummy metal pad formed, within an overlapping region between the first die and the second die, in the second bonding layer, wherein the at least one dummy metal pad is not electrically connected, wherein the at least one dummy metal pad contacts a dielectric of the first bonding layer of the first die.

11. The semiconductor package of claim 10, wherein the first bonding layer and the second bonding layer are made of silicon dioxide.

12. The semiconductor package of claim 11, wherein the at least one dummy metal pad is made of copper.

13. The semiconductor package of claim 12, wherein the at least one dummy metal pad is configured to reduce water-containing voids.

14. The semiconductor package of claim 10, wherein the at least one dummy metal pad comprises copper, and copper atoms of the at least one dummy metal pad are oxidized after the second die is bonded to the first die.

15. The semiconductor package of claim 10, wherein the at least one dummy metal pad comprises a rectangular dummy metal pad with a first side that is longer than a second side.

16. The semiconductor package of claim 10, wherein the at least one dummy metal pad comprises a first dummy metal pad and a second dummy metal pad, wherein the first dummy metal pad is larger than the second dummy metal pad.

17. The semiconductor package of claim 10, wherein the at least one dummy metal pad is positioned at a periphery of the second bonding layer of the second die, and wherein a central region of the second bonding layer is free of dummy metal pads.

18. The semiconductor package of claim 10, wherein the at least one dummy metal pad does not contact any metal pads in the first bonding layer.

19. A method comprising:

forming a first bonding layer at a top surface of a bottom die;

forming a second bonding layer at a bottom surface of a top die;

forming a third bonding layer at a bottom surface of a dummy die;

forming at least one dummy metal pad, within an overlapping region between the dummy die and the bottom die in the third bonding layer, the at least one dummy metal pad being not electrically connected;

bonding, using hybrid bonding, the top die on the bottom die by bonding the first bonding layer and the second bonding layer; and bonding the dummy die on the bottom die by bonding the first bonding layer and the third bonding layer, wherein the at least one dummy metal pad contacts a dielectric of the first bonding layer of the bottom die.

20. The method of claim 19, wherein the first bonding layer, the second bonding layer, and the third bonding layer are made of silicon dioxide, and wherein the at least one dummy metal pad is made of copper.

* * * * *